(12) United States Patent
Choi et al.

(10) Patent No.: US 7,923,304 B2
(45) Date of Patent: Apr. 12, 2011

(54) INTEGRATED CIRCUIT PACKAGING SYSTEM WITH CONDUCTIVE PILLARS AND METHOD OF MANUFACTURE THEREOF

(75) Inventors: DaeSik Choi, Seoul (KR); JoHyun Bae, Seoul (KR); Junghoon Shin, Cheongjoo-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/557,481

(22) Filed: Sep. 10, 2009

(65) Prior Publication Data

US 2011/0057308 A1    Mar. 10, 2011

(51) Int. Cl.
*H01L 21/00* (2006.01)
*H01L 21/44* (2006.01)
(52) U.S. Cl. ......... 438/127; 438/611
(58) Field of Classification Search .......... None
See application file for complete search history.

(56) References Cited

U.S. PATENT DOCUMENTS

| | | | | |
|---|---|---|---|---|
| 5,550,403 A * | 8/1996 | Carichner | | 257/702 |
| 5,726,493 A * | 3/1998 | Yamashita et al. | | 257/698 |
| 6,127,833 A * | 10/2000 | Wu et al. | | 324/755 |
| 6,137,163 A * | 10/2000 | Kim et al. | | 257/686 |
| 6,740,964 B2 * | 5/2004 | Sasaki | | 257/687 |
| 6,812,066 B2 * | 11/2004 | Taniguchi et al. | | 438/121 |
| 6,847,109 B2 | 1/2005 | Shim | | |
| 7,185,426 B1 * | 3/2007 | Hiner et al. | | 29/841 |
| 7,187,068 B2 | 3/2007 | Suh et al. | | |
| 7,224,054 B2 * | 5/2007 | Shibata | | 257/684 |
| 7,344,917 B2 * | 3/2008 | Gautham | | 438/106 |
| 7,378,726 B2 * | 5/2008 | Punzalan et al. | | 257/686 |
| 7,563,703 B2 * | 7/2009 | Brun et al. | | 438/613 |
| 2007/0216006 A1 | 9/2007 | Park et al. | | |
| 2007/0273049 A1 | 11/2007 | Khan et al. | | |
| 2008/0006942 A1 | 1/2008 | Park et al. | | |
| 2009/0014859 A1 * | 1/2009 | Jeung et al. | | 257/686 |
| 2009/0039523 A1 * | 2/2009 | Jiang et al. | | 257/777 |

* cited by examiner

*Primary Examiner* — Scott B Geyer
(74) *Attorney, Agent, or Firm* — Mikio Ishimaru

(57) ABSTRACT

A method of manufacture of an integrated circuit packaging system includes: providing a substrate; forming a conductive pillar, having substantially parallel vertical sides, in direct contact with the substrate; mounting an integrated circuit to the substrate beside the conductive pillar; and encapsulating the integrated circuit with an encapsulation having a top surface formed for the conductive pillar to extend beyond.

4 Claims, 8 Drawing Sheets

INTEGRATED CIRCUIT PACKAGING SYSTEM WITH CONDUCTIVE PILLARS AND METHOD OF MANUFACTURE THEREOF

TECHNICAL FIELD

The present invention relates generally to an integrated circuit packaging system and more particularly to a system for utilizing conductive pillars in an integrated circuit packaging system.

BACKGROUND

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; forming a conductive pillar, having substantially parallel vertical sides, in direct contact with the substrate; mounting an integrated circuit to the substrate beside the conductive pillar; and encapsulating the integrated circuit with an encapsulation having a top surface formed for the conductive pillar to extend beyond.

The present invention provides an integrated circuit packaging system including: a substrate; a conductive pillar, having substantially parallel vertical sides, in direct contact with the substrate; an integrated circuit mounted to the substrate beside the conductive pillar; and an encapsulation that encapsulates the integrated circuit, and the conductive pillar extends from the substrate through the encapsulation and extends beyond a top surface of the encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
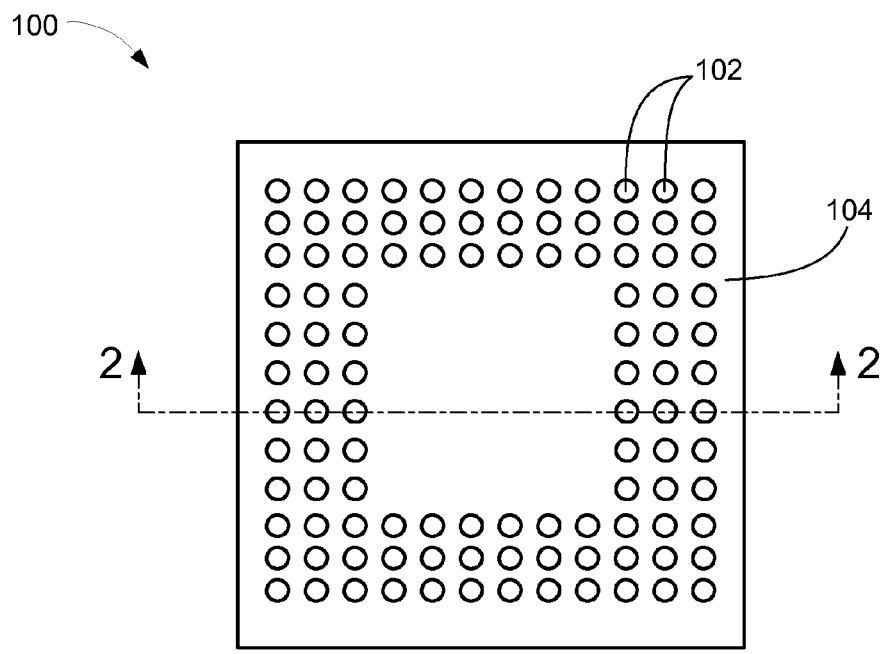
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in an embodiment of the present invention. The integrated circuit packaging system 100 is shown having conductive pillars 102 such as copper or aluminum pillars exposed from an encapsulation 104. The encapsulation 104, such as film assisted molding, protects sensitive components from moisture, dust and other contamination while adding structural rigidity to the conductive pillars 102.

Figure 2:
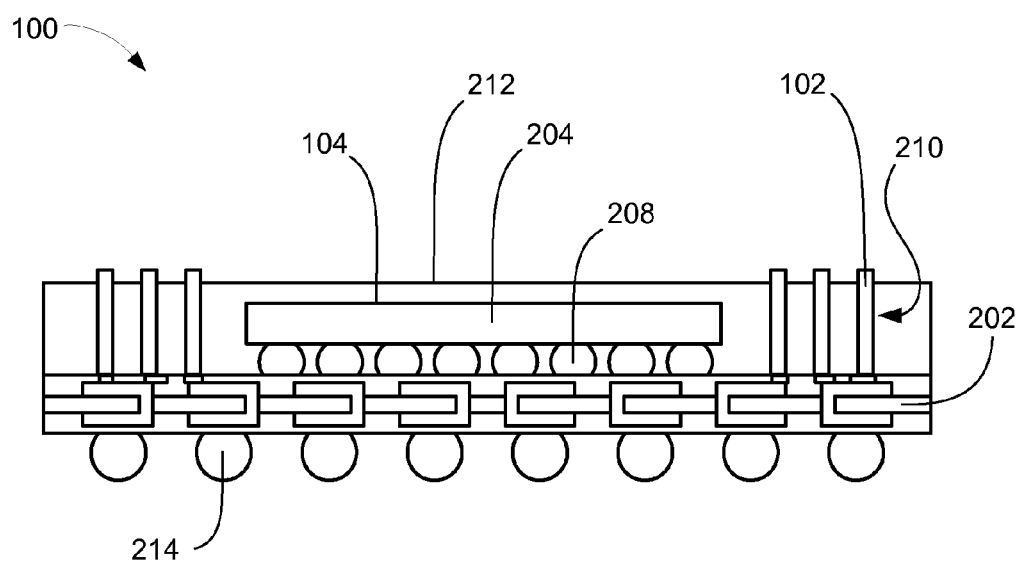
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 of FIG. 1 is shown having a substrate 202 such as a laminated plastic or ceramic substrate.

Mounted above the substrate 202 is an integrated circuit 204 such as a flip-chip. The integrated circuit 204 is electrically connected to the substrate 202 with interconnects such as solder balls 208.

Above the substrate 202, the conductive pillars 102 are connected to the substrate 202 and mounted around a perimeter of the integrated circuit 204. It has been discovered that the use of the conductive pillars 102 can greatly improve the input/output connection density because of the ability to form the conductive pillars 102 with an extremely fine pitch.

The encapsulation 104 encapsulates the integrated circuit 204 and partially encapsulates the conductive pillars 102 above the substrate 202. The conductive pillars 102 are formed above the substrate 202 having substantially parallel vertical sides 210 extending from the substrate 202 through the encapsulation 104 and extending beyond a top surface 212 of the encapsulation 104.

It has been discovered that the conductive pillars 102 offer substantially better joint strength than similar solder bumps because the conductive pillars 102 inherently have a substantially greater shear modulus. Lastly, external interconnects such as solder bumps 214 are attached below the substrate 202.

Figure 3:
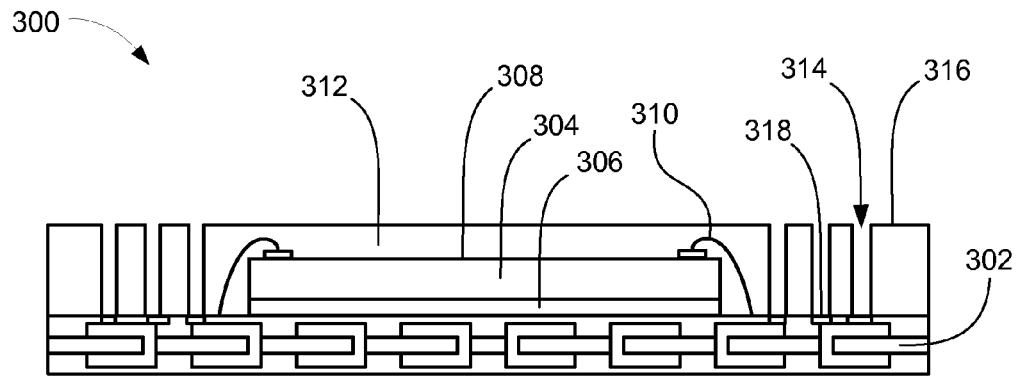
FIG. 3 is a cross-sectional view of an integrated circuit packaging system in a further embodiment of the present invention after a via formation phase of manufacture.

Referring now to FIG. 3, therein is shown a cross-sectional view of an integrated circuit packaging system 300 in a further embodiment of the present invention after a via formation phase of manufacture. The integrated circuit packaging system 300 is shown having a substrate 302 and an integrated circuit 304 mounted thereto with a die attach adhesive 306. The integrated circuit 304 such as a wire-bonded die has an active side 308 facing away from the substrate 302 and connected to the substrate 302 with bond wires 310.

The integrated circuit 304 and the bond wires 310 are encapsulated with an encapsulation 312 above the substrate 302. The encapsulation 312 has vias 314 formed substantially vertically and parallel through the encapsulation 312 from a top surface 316 of the encapsulation 312 to portions 318 of the substrate 302 exposed from the encapsulation 312 inside of the vias 314.

Figure 4:
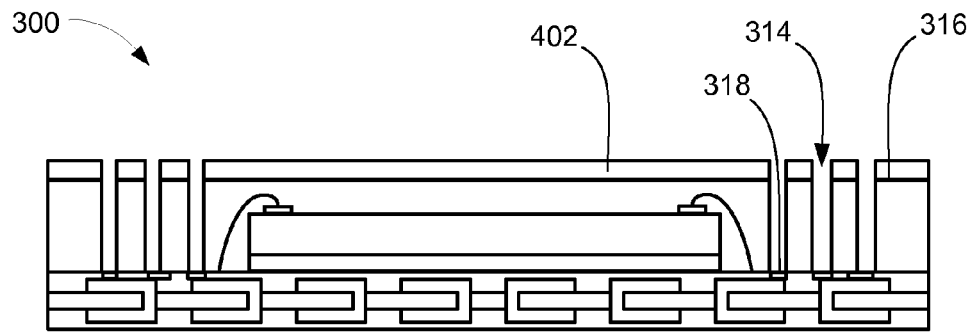
FIG. 4 is the integrated circuit packaging system of FIG. 3 after an upper passivation layer deposition phase of manufacture.

Referring now to FIG. 4, therein is shown the integrated circuit packaging system 300 of FIG. 3 after an upper passivation layer deposition phase of manufacture. The integrated circuit packaging system 300 is shown having a passivation layer 402 such as an upper passivation layer deposited on the top surface 316 of the encapsulation 312. The vias 314 through the encapsulation 312 are uncovered to expose the portions 318 of the substrate 302 in the vias 314.

Figure 5:
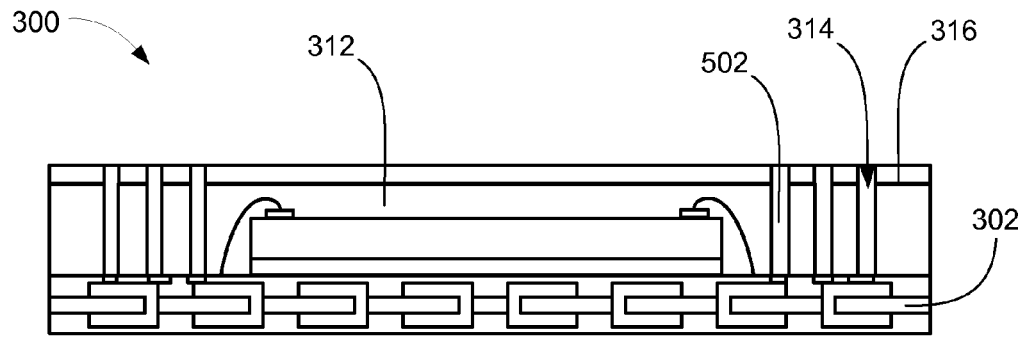
FIG. 5 is the integrated circuit packaging system of FIG. 3 after a via filling phase of manufacture.

Referring now to FIG. 5, therein is shown the integrated circuit packaging system 300 of FIG. 3 after a via filling phase of manufacture. The integrated circuit packaging system 300 is shown having the vias 314 filled with conductive pillars 502. The conductive pillars 502 connect to the substrate 302 and extend substantially vertically and parallel through the encapsulation 312 and extend vertically beyond the top surface 316 of the encapsulation 312.

Figure 6:
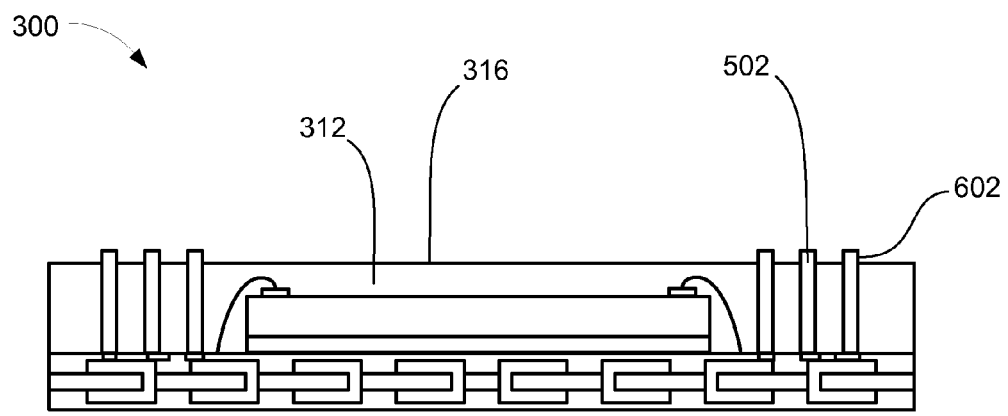
FIG. 6 is the integrated circuit packaging system of FIG. 3 after an upper passivation layer removal phase of manufacture.

Referring now to FIG. 6, therein is shown the integrated circuit packaging system 300 of FIG. 3 after an upper passivation layer removal phase of manufacture. The integrated circuit packaging system 300 is shown having the passivation layer 402 of FIG. 4 removed to expose side portions 602 of the conductive pillars 502 and are shown to extend substantially vertically and parallel above the top surface 316 of the encapsulation 312.

Figure 7:
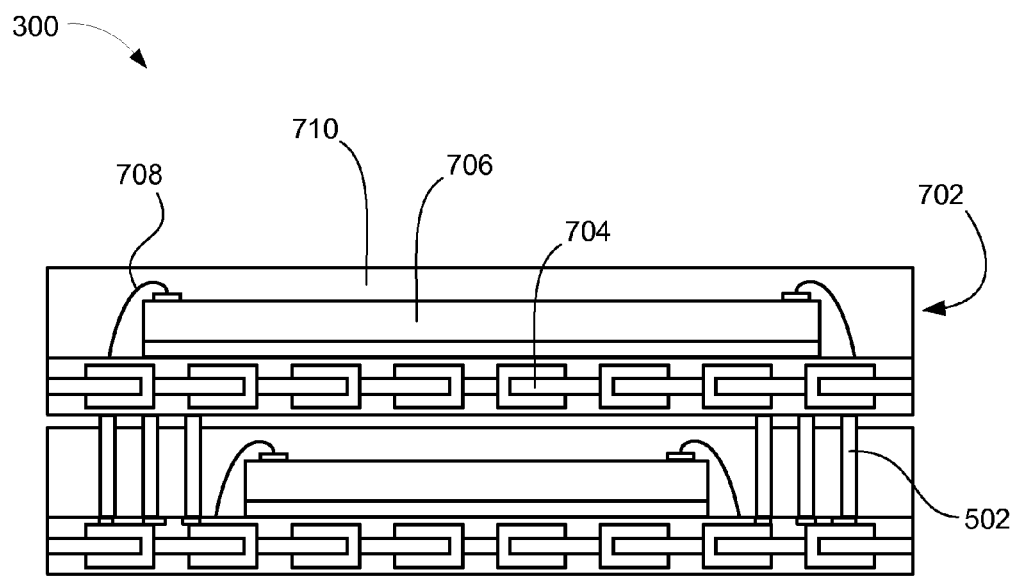
FIG. 7 is the integrated circuit packaging system of FIG. 3 after a package attach phase of manufacture.

Referring now to FIG. 7, therein is shown the integrated circuit packaging system 300 of FIG. 3 after a package attach phase of manufacture. The integrated circuit packaging system 300 is shown having an external package 702 mounted to the conductive pillars 502. It has been discovered that production cost, complexity, and time may be saved by mounting the external package 702 directly to the conductive pillars 502.

The external package 702 is shown having an external-package-integrated-circuit 704 connected to an external-package-substrate 706 with external-package-interconnects 708. The external package integrated circuit 704 is encapsulated above the external package substrate 706 with an external package encapsulation 710.

Figure 8:
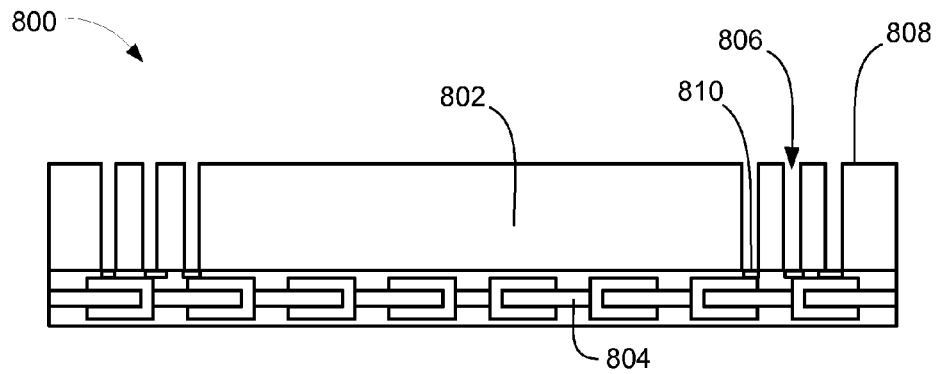
FIG. 8 is a cross-sectional view of an integrated circuit packaging system in a further embodiment of the present invention after a thick passivation layer deposition phase of manufacture.

Referring now to FIG. 8, therein is shown a cross-sectional view of an integrated circuit packaging system 800 in a further embodiment of the present invention after a thick passivation layer deposition phase of manufacture. The integrated circuit packaging system 800 is shown having a passivation layer 802 such as a thick passivation layer deposited above a substrate 804. The passivation layer 802 has vias 806 completely through the passivation layer 802 from a top surface 808 of the passivation layer to the substrate 804 where portions 810 of the substrate 804 are exposed from the passivation layer 802 in the vias 806.

Figure 9:
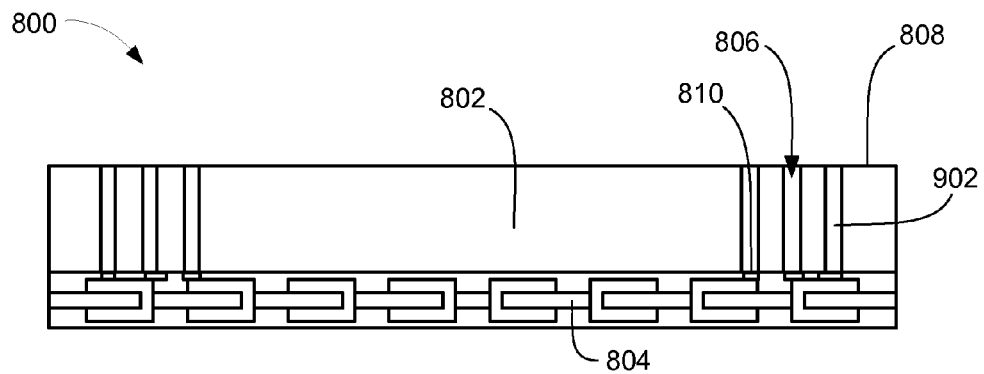
FIG. 9 is the integrated circuit packaging system of FIG. 8 after a via filling phase of manufacture.

Referring now to FIG. 9, therein is shown the integrated circuit packaging system 800 of FIG. 8 after a via filling phase of manufacture. The integrated circuit packaging system 800 is shown having the vias 806 of the passivation layer 802 filled with conductive pillars 902.

The conductive pillars 902 connect to the portions 810 of the substrate 804 exposed in the vias 806 from the passivation layer 802. The conductive pillars 902 extend substantially vertically and parallel from the substrate to the top surface 808 of the passivation layer 802.

Figure 10:
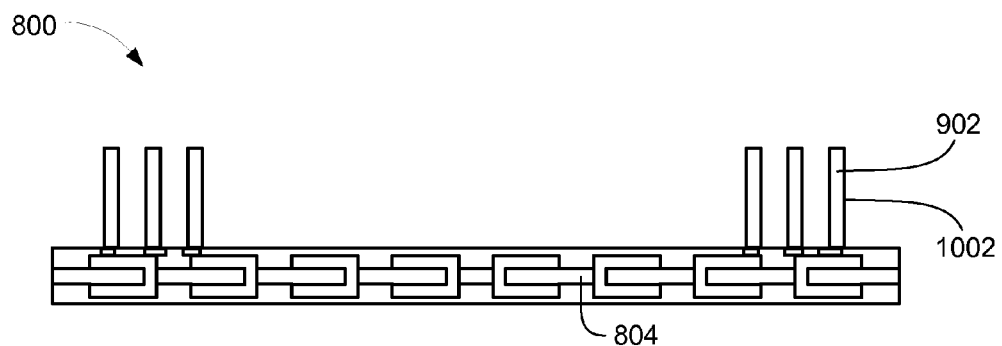
FIG. 10 is the integrated circuit packaging system of FIG. 8 after a passivation layer removal phase of manufacture.

Referring now to FIG. 10, therein is shown the integrated circuit packaging system 800 of FIG. 8 after a passivation layer removal phase of manufacture. The integrated circuit packaging system 800 is shown having the passivation layer 802 of FIG. 8 removed to expose sides 1002 of the conductive pillars 902 and the substrate 804.

Figure 11:
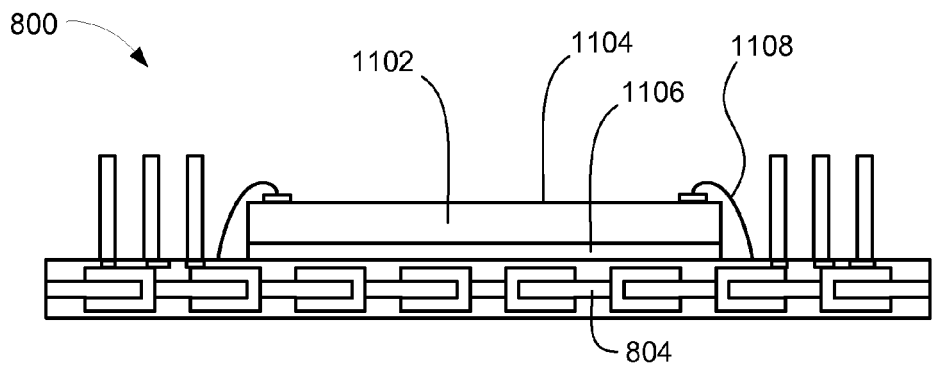
FIG. 11 is the integrated circuit packaging system of FIG. 8 after a die attach and wire bonding phase of manufacture.

Referring now to FIG. 11, therein is shown the integrated circuit packaging system 800 of FIG. 8 after a die attach and wire bonding phase of manufacture. The integrated circuit packaging system 800 is shown having an integrated circuit 1102 such as a wire-bonded die with an active side 1104 attached with die attach adhesive 1106 to the substrate 804.

The integrated circuit 1102 is mounted above the substrate 804 with the active side 1104 facing away from the substrate 804. The active side 1104 is electrically connected to the substrate with interconnects such as bond wires 1108. The integrated circuit 1102 is mounted having the conductive pillars peripheral to the integrated circuit 1102.

Figure 12:
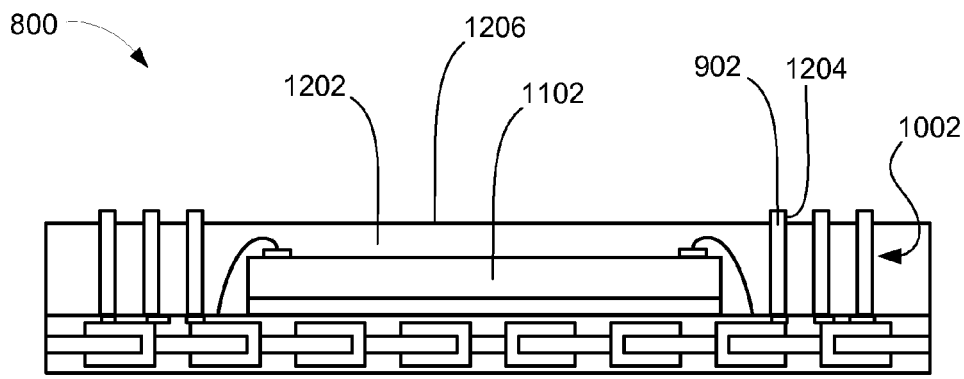
FIG. 12 is the integrated circuit packaging system of FIG. 8 after an encapsulation phase of manufacture.

Referring now to FIG. 12, therein is shown the integrated circuit packaging system 800 of FIG. 8 after an encapsulation phase of manufacture. The integrated circuit packaging system 800 is shown having an encapsulation 1202 encapsulating the integrated circuit 1102 and partially encapsulating the conductive pillars 902.

The conductive pillars 902 are shown having portions 1204 of the sides 1002 extending substantially vertically and parallel beyond a top surface 1206 of the encapsulation 1202.

Figure 13:
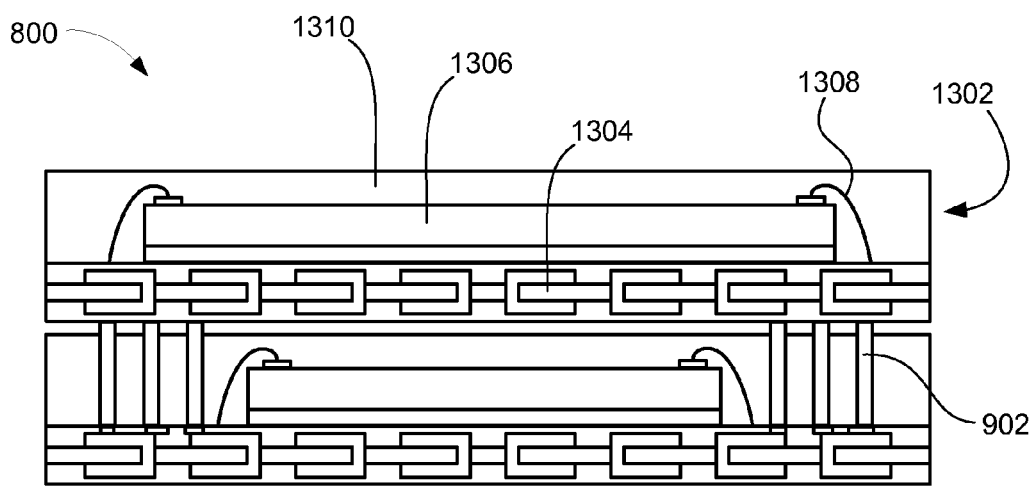
FIG. 13 is the integrated circuit packaging system of FIG. 8 after a package attach phase of manufacture.

Referring now to FIG. 13, therein is shown the integrated circuit packaging system 800 of FIG. 8 after a package attach phase of manufacture. The integrated circuit packaging system 800 is shown having an external package 1302 mounted to the conductive pillars 902.

The external package 1302 is shown having an external package integrated circuit 1304 connected to an external package substrate 1306 with external package bond wires 1308. The external package integrated circuit 1304 is encapsulated above the external package substrate 1306 with an external package encapsulation 1310.

Figure 14:
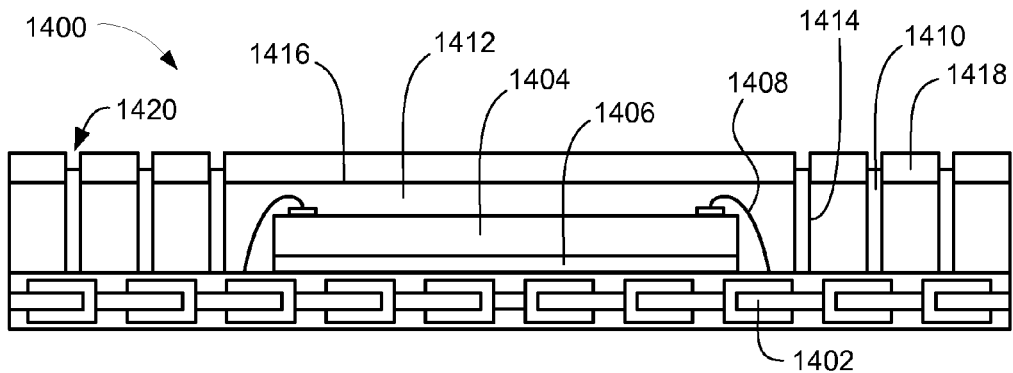
FIG. 14 is a cross-sectional view of an integrated circuit packaging system in a further embodiment of the present invention after a mold stencil attach phase of manufacture.

Referring now to FIG. 14, therein is shown a cross-sectional view of an integrated circuit packaging system 1400 in a further embodiment of the present invention after a mold stencil attach phase of manufacture. The integrated circuit packaging system 1400 is shown having a substrate 1402 such as a laminated plastic or ceramic substrate.

Mounted above the substrate 1402 is an integrated circuit 1404 such as a wire-bonded die. The integrated circuit 1404 is attached to the substrate 1402 with a die attach adhesive 1406 and is electrically connected to the substrate 1402 with interconnects such as bond wires 1408.

Above the substrate 1402, conductive pillars 1410 are connected to the substrate 1402 and mounted around a perimeter of the integrated circuit 1404. An encapsulation 1412 encapsulates the integrated circuit 1404 and partially encapsulates the conductive pillars 1410 above the substrate 1402. The conductive pillars 1410 are formed above the substrate 1402 having substantially parallel vertical sides 1414 extending from the substrate 1402 through the encapsulation 1412 and extending beyond a top surface 1416 of the encapsulation 1412.

Attached to the top surface 1416 of the encapsulation 1412 is a stencil 1418. The stencil 1418 has vias 1420 which align with the conductive pillars 1410. The stencil 1418 is thicker than the height that the conductive pillars 1410 extend past the top surface 1416 of the encapsulation 1412. The vias 1420 of the stencil 1418 therefore are partially filled by the conductive pillars 1410 and partially empty.

Figure 15:
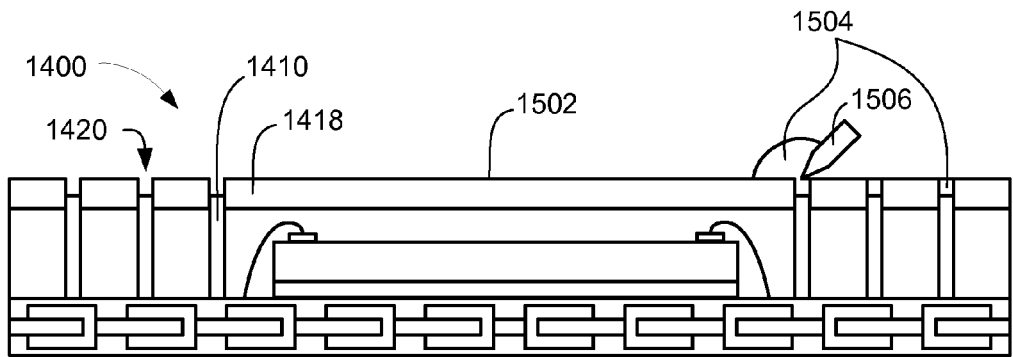
FIG. 15 is the integrated circuit packaging system of FIG. 14 in a solder paste deposition phase of manufacture.

Referring now to FIG. 15, therein is shown the integrated circuit packaging system 1400 of FIG. 14 in a solder paste deposition phase of manufacture. The integrated circuit packaging system 1400 is shown having the vias 1420 of the stencil 1418 filled level with a top surface 1502 of the stencil 1418 with solder paste 1504. The solder paste 1504 may be spread across the top surface 1502 of the stencil 1418 with an edged tool 1506 such as a squidgy.

Figure 16:
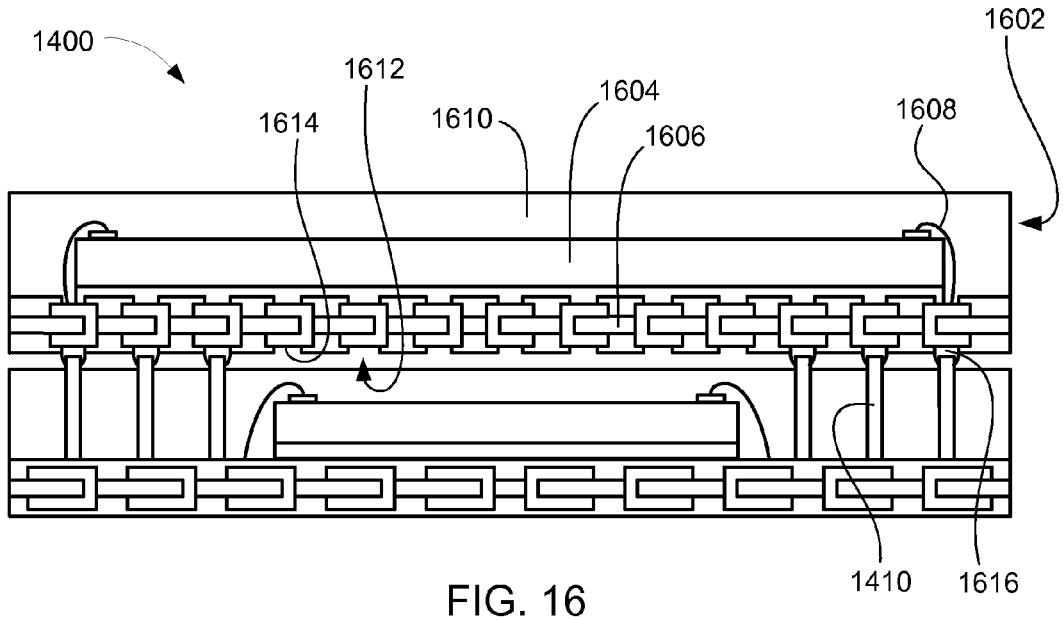
FIG. 16 is the integrated circuit packaging system of FIG. 14 after a package attach phase of manufacture.

Referring now to FIG. 16, therein is shown the integrated circuit packaging system 1400 of FIG. 14 after a package attach phase of manufacture. The integrated circuit packaging system 1400 is shown having the stencil 1418 of FIG. 14 removed and is shown having an external package 1602 mounted to the conductive pillars 1410.

The external package 1602 is shown having an external package integrated circuit 1604 connected to an external package substrate 1606 with external package bond wires 1608. The external package integrated circuit 1604 is encapsulated above the external package substrate 1606 with an external package encapsulation 1610.

The external package substrate 1606 includes substrate ports 1612 which expose substrate connection points 1614 that are electrically connected to the conductive pillars 1410. After reflow, the solder paste 1504 of FIG. 15 becomes solder joints 1616 and will help to anchor the conductive pillars 1410 in the substrate ports 1612.

Figure 17:
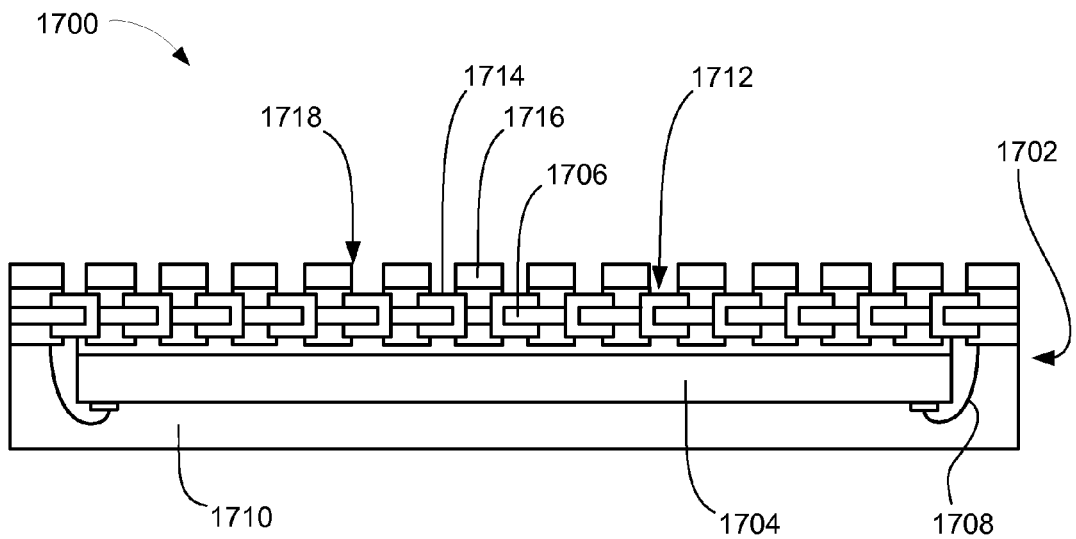
FIG. 17 is a cross-sectional view of an integrated circuit packaging system in a further embodiment of the present invention after a substrate stencil attach phase of manufacture.

Referring now to FIG. 17, therein is shown a cross-sectional view of an integrated circuit packaging system 1700 in a further embodiment of the present invention after a substrate stencil attach phase of manufacture. The integrated circuit packaging system 1700 is shown having an external package 1702 with an external package integrated circuit 1704 connected to an external package substrate 1706 with external package bond wires 1708. The external package integrated circuit 1704 is encapsulated with an external package encapsulation 1710.

The external package substrate 1706 includes substrate ports 1712 which expose substrate connection points 1714. Attached to the external package substrate 1706 is a stencil 1716 having vias 1718. The vias 1718 of the stencil 1716 align with the substrate ports 1712 of the external package substrate 1706 leaving the substrate connection points 1714 exposed.

Figure 18:
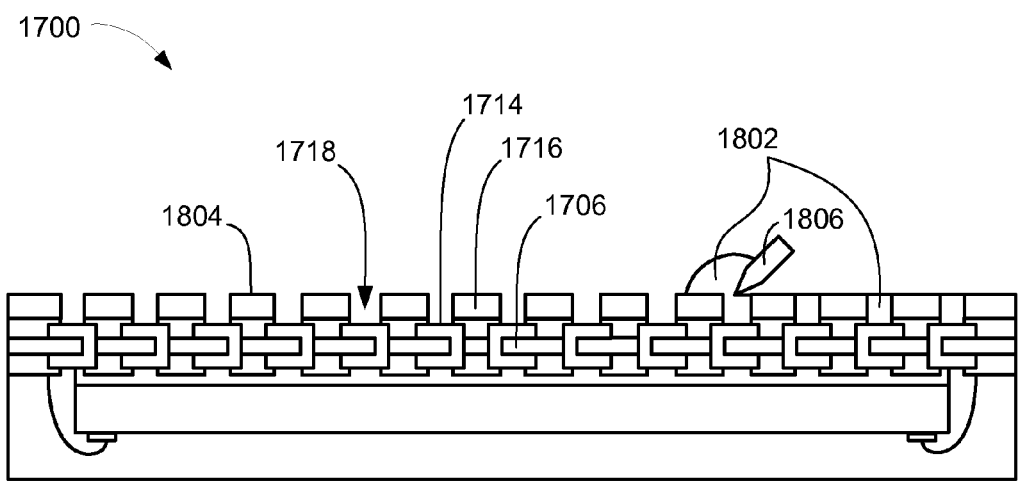
FIG. 18 is the integrated circuit packaging system of FIG. 17 in a solder paste deposition phase of manufacture.

Referring now to FIG. 18, therein is shown the integrated circuit packaging system 1700 of FIG. 17 in a solder paste deposition phase of manufacture. The integrated circuit packaging system 1700 is shown having the vias 1718 of the stencil 1716 and the substrate ports 1712 of the external package substrate 1706 filled with a solder paste 1802. The solder paste 1802 fills from the substrate connection points 1714 of the external package substrate 1706 to a top surface 1804 of the stencil 1716. The solder paste 1802 may be spread across the top surface 1804 of the stencil 1716 with an edged tool 1806 such as a squidgy.

Figure 19:
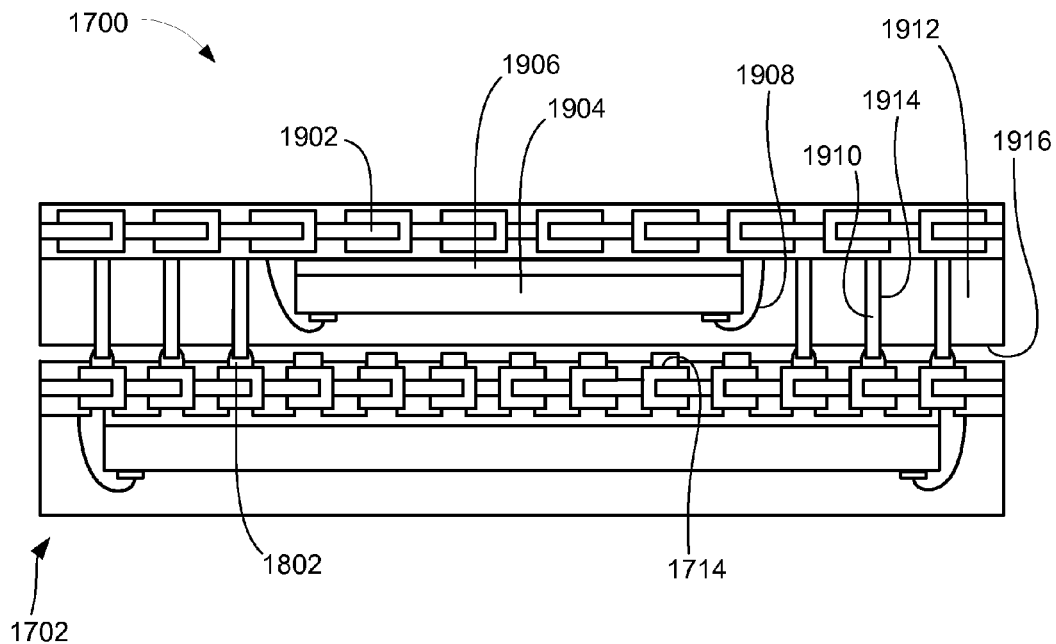
FIG. 19 is the integrated circuit packaging system of FIG. 17 after a package attach phase of manufacture.

Referring now to FIG. 19, therein is shown the integrated circuit packaging system 1700 of FIG. 17 after a package attach phase of manufacture. The integrated circuit packaging system 1700 is shown having a substrate 1902 such as a laminated plastic or ceramic substrate.

Mounted above the substrate 1902 is an integrated circuit 1904 such as a wire-bonded die. The integrated circuit 1904 is attached to the substrate 1902 with a die attach adhesive 1906 and is electrically connected to the substrate 1902 with interconnects such as bond wires 1908.

Above the substrate 1902, conductive pillars 1910 are connected to the substrate 1902 and mounted around a perimeter of the integrated circuit 1904. An encapsulation 1912 encapsulates the integrated circuit 1904 and partially encapsulates the conductive pillars 1910 above the substrate 1902. The conductive pillars 1910 are formed above the substrate 1902 having substantially parallel vertical sides 1914 extending from the substrate 1902 through the encapsulation 1912 and extending beyond a bottom surface 1916 of the encapsulation 1912.

The substrate connection points 1714 of the external package 1702 are connected to the conductive pillars 1910. The conductive pillars 1910 are inserted into the solder paste 1802 within the substrate ports 1712. After a reflow process the solder paste 1802 can help anchor the conductive pillars 1910 to the substrate connection points 1714.

Figure 20:
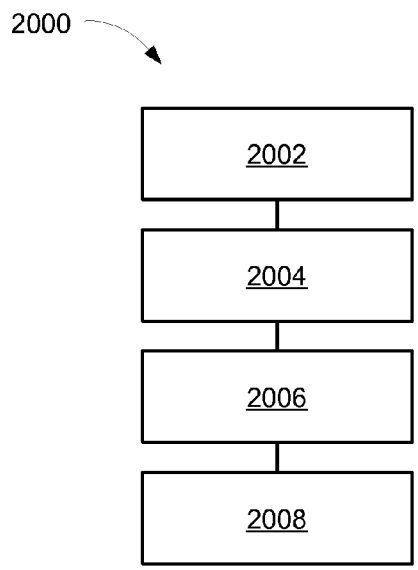
FIG. 20 is a flow chart of a method of manufacture of an integrated circuit packaging system in a further embodiment of the present invention.

Referring now to FIG. 20, therein is shown a flow chart of a method 2000 of manufacture of an integrated circuit packaging system 100 of FIG. 1 in a further embodiment of the present invention. The method 2000 includes providing a substrate in a block 2002; forming a conductive pillar, having substantially parallel vertical sides, in direct contact with the substrate in a block 2004; mounting an integrated circuit to the substrate beside the conductive pillar in a block 2006; and encapsulating the integrated circuit with an encapsulation having a top surface formed for the conductive pillar to extend beyond in a block 2008.

Thus, it has been discovered that the conductive pillar system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
   providing a substrate;
   forming a conductive pillar, having substantially parallel vertical sides, in direct contact with the substrate including forming a passivation layer having a via, above the substrate;
   filling the via of the passivation layer with the conductive pillar;
   removing the passivation layer;
   mounting an integrated circuit to the substrate beside the conductive pillar; and
   encapsulating the integrated circuit with an encapsulation having a top surface formed for the conductive pillar to extend beyond, including forming the encapsulation around the conductive pillar and leaving side portions of the conductive pillar exposed above the top surface of the encapsulation.

2. The method as claimed in claim 1 further comprising:
   forming a second conductive pillar including forming a via through the encapsulation;
   forming a second passivation layer on the top surface of the encapsulation;
   filling the via with the conductive pillar beyond the top surface of the encapsulation; and
   removing the second passivation layer to expose side portions of the conductive pillars above the encapsulation.

3. The method as claimed in claim 1 wherein:
   mounting the integrated circuit includes mounting a flip-chip or a wire-bonded die.

4. The method as claimed in claim 1 further comprising:
   depositing a solder paste atop the conductive pillar.

* * * * *

UNITED STATES PATENT AND TRADEMARK OFFICE
CERTIFICATE OF CORRECTION

| | | |
|---|---|---|
| PATENT NO. | : 7,923,304 B2 | Page 1 of 1 |
| APPLICATION NO. | : 12/557481 | |
| DATED | : April 12, 2011 | |
| INVENTOR(S) | : Choi et al. | |

It is certified that error appears in the above-identified patent and that said Letters Patent is hereby corrected as shown below:

Column 8:

lines 34-40, claim 1, delete:

"forming a conductive pillar, having substantially parallel vertical sides, in direct contact with the
  substrate including forming a passivation layer having a via, above the substrate;

filling the via of the passivation layer with the conductive pillar;

removing the passivation layer;"

and insert therefor

--forming a conductive pillar, having substantially parallel vertical sides, in direct contact with the
  substrate including:
   forming a passivation layer having a via, above the substrate;
   filling the via of the passivation layer with the conductive pillar; and
   removing the passivation layer;--

Signed and Sealed this
Twenty-first Day of June, 2011

David J. Kappos
*Director of the United States Patent and Trademark Office*